| United States Patent [19] | [11] Patent Number: 4,734,923 |
| --- | --- |
| Frankel et al. | [45] Date of Patent: Mar. 29, 1988 |

[54] LITHOGRAPHIC SYSTEM MASK INSPECTION DEVICE

[75] Inventors: Robert D. Frankel; John F. Hoose, both of Rochester, N.Y.

[73] Assignee: Hampshire Instruments, Inc, Rochester, N.Y.

[21] Appl. No.: 864,543

[22] Filed: May 19, 1986

[51] Int. Cl.[4] .............................................. G21K 5/10
[52] U.S. Cl. ...................................... 378/34; 378/58; 250/491.1; 250/492.2
[58] Field of Search ....................... 378/34, 35, 54, 58; 250/492.2 R, 492.2 B, 252.1, 491.1

[56] References Cited

U.S. PATENT DOCUMENTS 3,745,358 7/1973 Firtz et al. ........................ 250/491.1
4,559,603 12/1985 Yoshikawa ........................ 250/492.1

Primary Examiner—Janice A. Howell
Assistant Examiner—David P. Porta
Attorney, Agent, or Firm—Harry W. Barron

[57] ABSTRACT

A device used to test the features of a mask used in a semiconductor lithographic machine. The device includes an array of charge couple devices and an array of pinholes positioned above the charge couple devices. The array of pinholes includes a small pinhole opening for each of the charge couple devices in that array and the size of each opening is dependent upon the resolution of the mask features desired to be inspected. The array of pinholes and the array of charge couple devices are moved in unison in discrete steps, related to the size of the pinhole openings, across an area of the mask related to the center to center spacing of the charge couple devices of the charge couple device array. By reading the data of each of the charge couple devices after each step, a comparison can be made against data previously obtained from a known good mask and a determination can be made whether the mask under test is acceptable or flawed.

50 Claims, 6 Drawing Figures

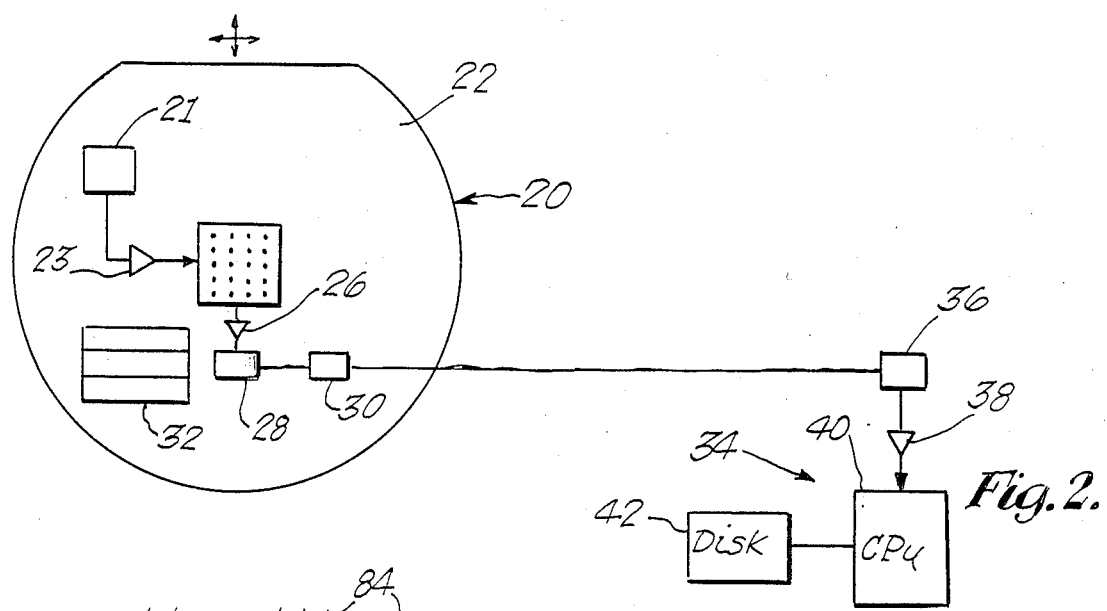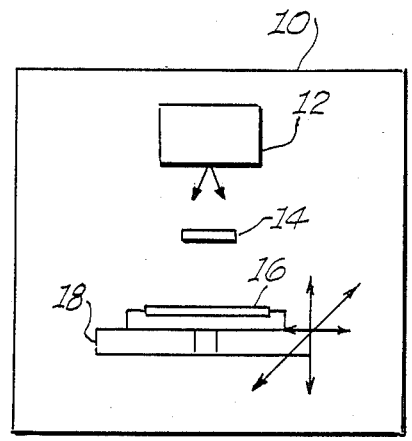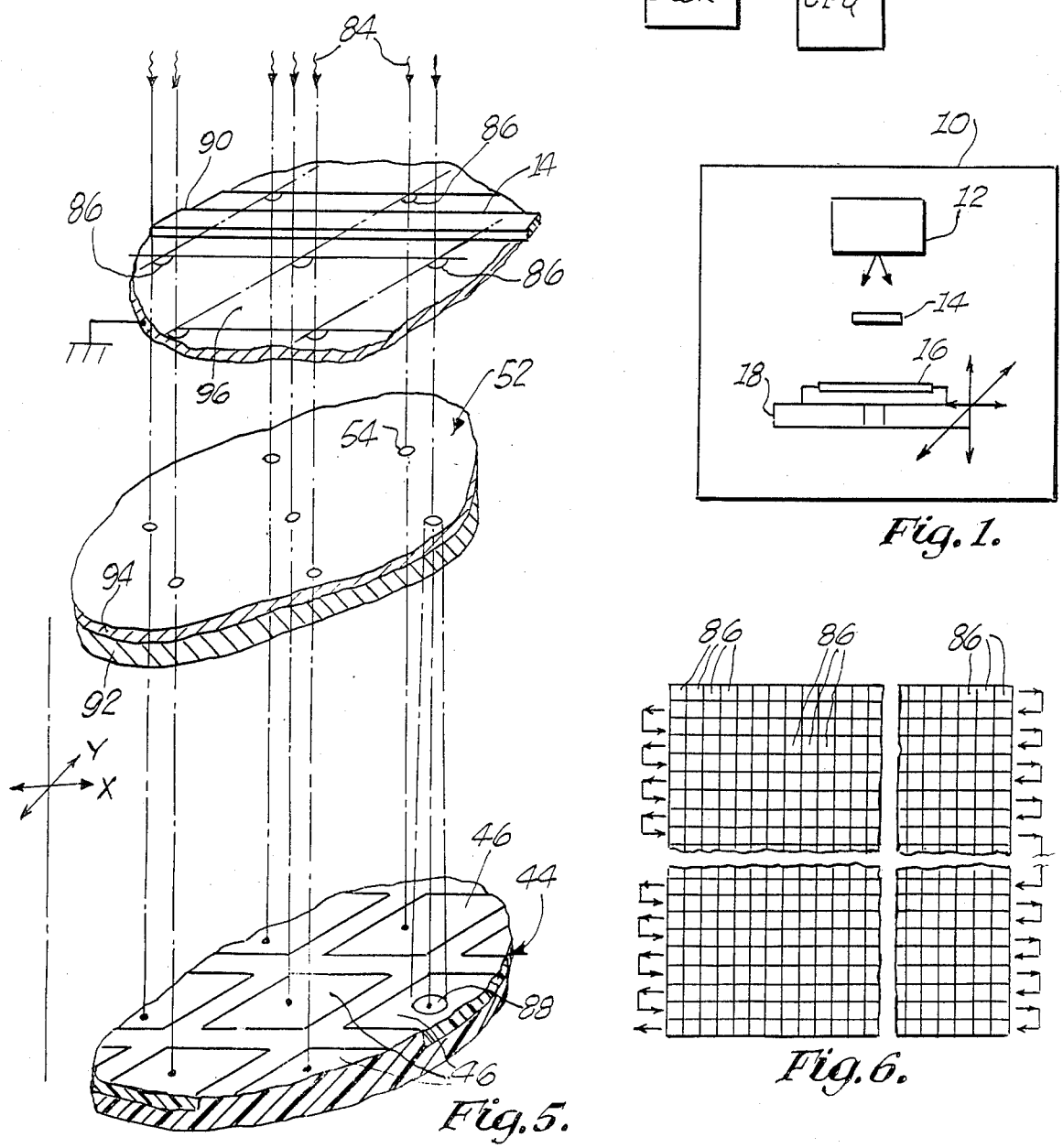

LITHOGRAPHIC SYSTEM MASK INSPECTION DEVICE

This invention relates to a lithographic system mask inspection device and more particularly to such a device used for inspecting minute features of an optical imaging mask or x-ray imaging mask included in a lithographic system of the type for manufacturing semiconductor devices.

In conventional optical lithography systems of the type used to manufacture semiconductor devices, light is transmitted through a mask towards a resist covered wafer. The mask blocks a certain portion of the light so that a pattern of light is focused on the resist layer of the wafer. This light pattern causes a corresponding exposure pattern of the resist layer, whereby certain desired portions of the resist layer can be removed during the semiconductor device fabrication process. In recent years an advancement in lithography equipment has replaced the ultraviolet light source with a source of x-rays. Since x-rays have a shorter wavelength than ultraviolet light, smaller features can be written the resist. Conventional ultraviolet light mask features may be as small as one micron in size, whereas x-ray lithography equipment permits features as small as 2/10ths of a micron to be placed on the wafer.

In fabricating even a single semiconductor device, many different layers are required. For each layer, a different pattern is exposed onto the wafer and for each pattern, a different mask correspondingly must be used. Thus, the lithography equipment includes mask handling means for repeatedly moving each mask into and out of position with respect to the energy source. Extreme care must be taken not to damage the mask. Even the smallest scratch or particle of dust is many times larger than the minute features which appear on the mask, which as previously mentioned may be as small as a few tenths of a micron.

Despite the many precautions which are taken to prevent damage to the mask, it is still necessary to periodically check the mask in order to assure that the pattern projected through the mask is the same as the desired pattern. In the past, the testing of a mask to ensure that the pattern remains correct has been accomplished either by optically observing the mask or by testing large sections of the mask against known data. The problem in the prior art is that features less than one micron in size were difficult to test. This historically has not been a problem because it has only been in recent years that features approaching a micron size have been able to be reproduced by conventional lithography techniques. The newer machines, such as the X-ray lithography machines, will allow features of several tenths of a micron to be fabricated on resist covered wafers. For such minute features it is necessary to check the mask with a much higher resolution than in the past to ensure that each of the small features of the mask are present and that no additional foreign substances are on the mask.

In accordance with one aspect of this invention, there is provided a mask inspection device for inspecting features larger than a given size on an image defining mask used in a semiconductor imaging system. The system is of a type in which energy is provided towards the mask to thereby cause an image of energy to be provided during a semiconductor fabrication process. The mask inspection device comprises a substrate having an array of energy responsive devices thereon and an array of energy transmissive openings, each of which opening corresponds to and is aligned with one of the energy responsive devices. Each opening has a size related to the given size and the array of openings is positioned remote from the energy responsive devices such that any energy applied through an opening is applied to the energy responsive device corresponding to that opening. In addition, the mask inspection device includes means for providing data manifesting the changed condition of the energy responsive devices to comparing means for a determination of the mask features.

One preferred embodiment of the subject invention is hereafter described with specific reference being made to the following Figures, in which:

FIG. 1 shows a schematic illustration of a semiconductor fabrication machine;

FIG. 2 shows a substrate on which the apparatus of the subject invention is placed;

FIG. 5 shows a more detailed diagram useful in understanding the operation of the invention; and FIG. 6 shows the scan path of the inspection device of the subject invention.

Figure 3:
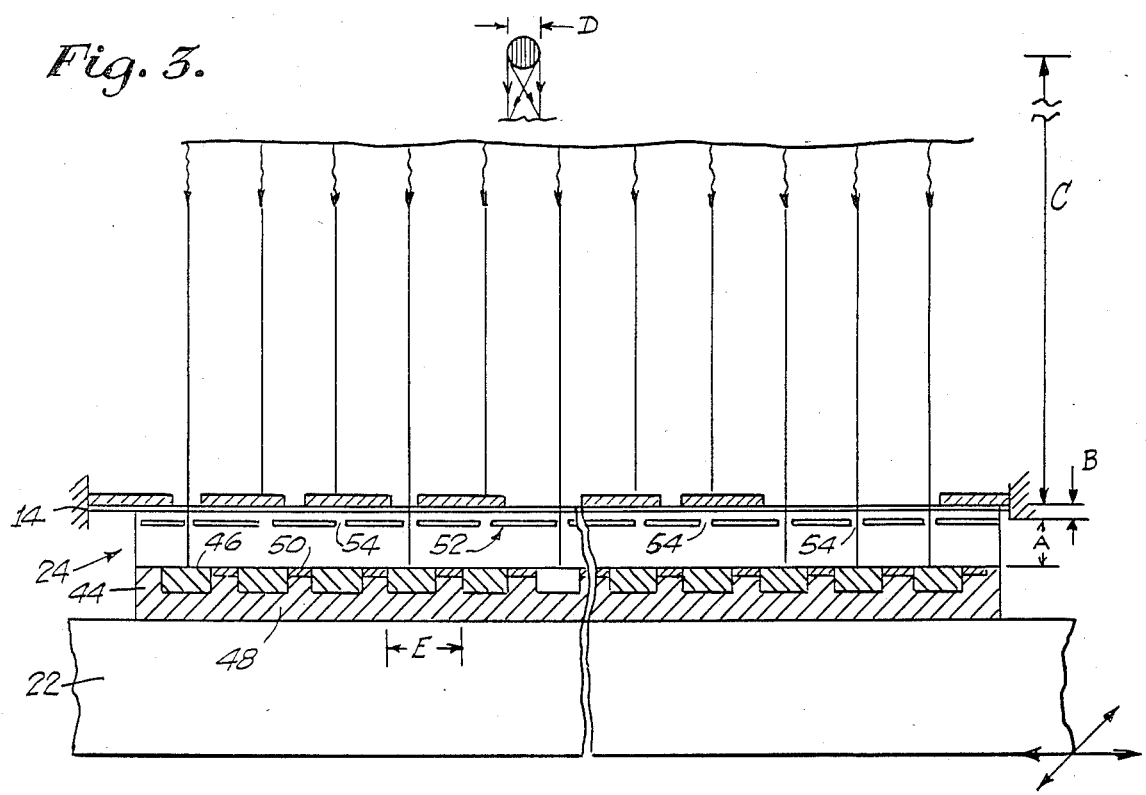
FIG. 3 shows one type of testing device of the subject invention together with the associated mask under test for use in an x-ray lithography system.

Referring now to FIG. 1, a schematic illustration is shown of a typical semiconductor fabrication lithography system 10. System 10 includes an energy source 12 which may be either a source of ultraviolet light or a source of x-rays. An example of such an x-ray source is shown in U.S. Pat. No. 4,184,078, entitled "Pulsed X-Ray Lithography", in the name of David J. Nagel et al, and an example of such an ultraviolet light source 12 is shown in U.S. Pat. No. 4,444,492, entitled "Apparatus For Projecting A Series of Images onto Dies of a Semiconductor Wafer" in the name of Martin E. Lee. The energy from source 12 is directed towards mask 14 which blocks some of the energy and allows other portions of the energy to be transmitted therethrough, whereby a pattern of energy is presented to semiconductor wafer 16. Wafer 16 is held by a stepper mechanism 18 which is capable of moving wafer 16 in the x, y, z, and theta directions. An example of such a stepper mechanism 18 and an ultraviolet light mask is shown in the aforementioned U.S. Pat. No. 4,444,492. Examples of a mask 14 useable with an x-ray source 12 are shown in U.S. Pat. No. 3,742,230, entitled "Soft X-ray Mask Support Substrate" in the name of David L. Spears et al. and U.S. Pat. No. 4,170,512 entitled "Method of Manufacture of a Soft X-ray Mask" in the name of Dale C. Flanders et al. Briefly, the ultraviolet light lithography system mask 14 may simply be a clear plate, such as glass, on which is placed black patterns which block the light and the X-ray mask may be an x-ray transparent membrane onto which a gold or tungsten pattern is placed.

The operation of lithography system 10 is as follows. Stepper mechanism 18 positions photoresist covered wafer 16 in a predefined position and energy from source 12 is provided through mask 14 and exposes a pattern on a specific small area of the photoresist covering wafer 16. Wafer 16 is then moved in one direction by stepper mechanism 18 by an amount related to size of the exposure thereon and energy is again provided from source 12 to expose the next adjacent area of wafer 16. This movement continues in the x direction along an entire row and then in the y direction to step across the next row. Ultimately, the movement in both the x and y direction continues until all adjacent areas on wafer 16 have been exposed. Thereafter, wafer 16 is removed from stepper mechanism 18 and further processed in the normal semiconductor fabrication techniques. While the distance moved between exposures from source 12 may be one centimeter or more at a time, the movement is broken down into a large number of small discrete steps. Such steps may be controlled by the use of a stepper motor or other step indexing techniques, with each step during the movement of wafer 16 by stepper mechanism 18 being as small as 1/10th of a micron.

Referring now to FIG. 2, the mask inspecting device 20 of the subject invention is shown. Device 20 includes a substrate 22 which may conveniently be the same size as a typical wafer such as wafer 16 shown in FIG. 1. Bonded or otherwise affixed to substrate 22 is an inspection station 24 which will be described in more detail hereafter with respect to FIGS. 3 and 4. Generally speaking however, inspection station 24 includes an array of energy responsive devices, such as charge coupled devices (CCD) or charge injection devices (CID). The array of energy responsive devices may be typically 500×500 devices, each of which have a center to center spacing of approximately 20 microns. Positioned directly above the array of energy responsive devices is a corresponding array of small openings, with each opening being as small as 1/10th of a micron. Each of the openings corresponds to and is aligned with one of the energy responsive devices and the limitation of the size of each of the openings is the smallest amount in which stepper mechanism 18 can reliably move substrate 22 when placed thereon.

As is well known, the output of the array of energy responsive devices may be read serial by device in a known manner. In order to control the reading of the CD devices, clock signals must be applied thereto. The clock signals may be provided by directing a pulsed laser (not shown) at a photo responsive diode 21 or other optical responsive device and providing the signal from diode 21 through signal conditioning and amplifying device 23 as the clock signals for the CCD array of inspection station 24.

The output from inspection station 24 is applied through a signal conditioning and amplifying circuit 26 to an analog to digital converter 28. Converter 28 converts the analog signal of the energy stored by each of the energy responsive devices of station 24 into a digital signal. If the device is set up so that the energy responsive devices are either saturated or unsaturated relative to a threshold voltage, then analog to digital converter 28 may be dispensed with. The output from converter 28 is applied to modulate an optical transmitter 30, which may be a light emitting diode or a laser transistor. In addition, mask inspecting device 20 includes an energy source 32 which may either be a series of batteries or solar cells which can be powered by a laser beam or other light source.

The light provided by optical transmitter 30 is sent to data receiving system 34 which includes an optical receiver 36 and an associated signal conditioning and amplifying circuit 38. The output from circuit 38 is provided to a central processing unit (CPU) 40 which may be a conventional digital computer which has associated therewith a large magnetic media storage device, such as a disk unit 42. Disk unit 42 is provided with stored data obtained from a known good mask and the data provided by receiver 36 and sent to processor 40 may be compared with the data stored in disk unit 42 to determine if the data received by inspection station 24 corresponds to the known good data. If the data received is good, an indication that the mask is proper for further usage will be given by processor 40. If the data compared by processor 40 is different than the data stored in disk 42, then an indication will be made that the mask being inspected has a flaw. Further, the details regarding the flaw can also be provided by proper data processing.

Referring now to FIG. 3, a detailed view of the inspection station 24 for use with an x-ray lithography system is shown. The inspection station 24 is shown as being bonded to substrate 22 which may be either a semiconductor wafer or other well known substrate materials having the shape of a conventional semiconductor wafer. Such shape is desirable so that substrate 22 may be placed directly in a stepper mechanism 18 as shown in FIG. 1 and be moved in a manner to be described hereafter by the stepper mechanism 18. With this arrangement, the actual lithographic machine can be used as the mask inspection machine by only adding the apparatus shown in FIG. 2.

Inspection station 24 includes a 500×500 array 44 of charge couple devices (CCD). CCD array 44 may be any conventional charge couple device array such as the Texas Instruments Model No T.I. 4849, manufactured by Tex. Instruments of Dallas, Tex. As is well known, a charge couple device is the type of device which can retain a charge in response to an energy applied thereto. The energy may either be an energy wave, such as light or x-rays, or it may be an electric voltage or stream of electrons. Charge couple devices generally include a charge storage region 46 fabricated into a semiconductor substrate 48. Each of the regions 46 are connected by a channel region 48 which allows the charge in one region 46 to be transferred to the adjacent region 46 upon command of the appropriate signals on clock lines (not shown). Fabricated in this manner, a charge couple device is the equivalent of a large shift register in which data (the charge) may be transferred from one device to the next adjacent device.

By appropriate output connections and amplifying circuits, the information, or stored charge, in the CCD array can be read in a serial manner. It should also be noted that the individual charge couple device regions 46 may store energy at different levels and by applying the energy level to an analog to digital converter, such as converter 28 shown in FIG. 2, a digital signal can be created manifesting the exact energy level. In certain applications, the individual regions 46 may become charged either above or below a certain threshold value, depending on the application or nonapplication of energy thereto based on the presence or absence of energy blocking by the mask 14. In such an application, the output may be directly read as a pure digital signal.

Positioned a distance of A above the CCD array 44 is a pinhole array 52. Pinhole array 52 has an array of small openings 54, each positioned directly above an associated, or corresponding, one of the CCD device charge storing regions 46. Each of the openings 54 should be as small as the resolution desired to be checked of the features of mask 14. For example if it is desired to check features as small as 1/10th of a micron for mask 14, then the dimension of each of the openings 54 should correspondingly be 1/10th of a micron. However, stepper mechanism 18 then must be capable of moving the inspection station 24 in steps of 1/10th of a micron.

Pinhole array 52 may be fabricated by providing a silicon membrane substrate which has been covered by a thin layer of gold or tungsten material having openings 54 therein. Array 52 may be fabricated by covering membrane with a resist material and then exposing the area where openings 54 are to be placed by the use of electron beam writing techniques, well known in the art of mask making. Thereafter, the nonexposed resist may be removed, leaving the resist in the opening 54 area. The resulting membrane can then be covered by a 2-3 micron layer of gold by known electroplating techniques and the remaining resist removed, thereby leaving openings 54.

The top surface of pin hole array 52 is designed to be positioned in the plane in which the top of the photoresist layer of a substrate would normally be positioned. In an x-ray lithography system such, as shown in FIG. 3, mask 14 is positioned a small distance B above that plane. The x-ray source 56 is positioned a substantial distance C away from mask 14. For example, distance C may be as much as 7 centimeters and distance may be 20 microns. The distance A separating pin hole array 52 from CCD array 44 should be selected to allow some magnification from the opening 54 to the region 46. This magnification would be dependent on the size of source 56 which has a diameter D. An example of such a source diameter D is 100 microns if the laser induced plasma x-ray source technique shown in U.S. Pat. No. 4,184,078, is utilized. Thus, the stream of x-rays would spread an amount proportional to the distance D and C from each pinhole 54 based on the ratio A/C. This assumes distance B is so small it can be neglected. In order to utilize the spreading action of the x-rays generated from source 56, distance A should be selected to be between 2 and 4 millimeters for CCD devices of 20 microns (Distance E in FIG. 3). This allows a broader area of region 46 of each CCD device to be charged by the x-rays due to the spread. Specifically distance A may be selected to be 3.5 millimeters which is 1/20th of distance C between source 56 and mask 14. By making distance A 3.5 millimeters, the area of region 46 bombarded by x-rays would be generally a circle of a diameter of approximately five microns. However, with oil to 0.3 micron opening size, Fresnal difraction can become a problem and this can be overcome by reducing the distance A to between 0.7 and 1.0 millimeters. This, of course, is at the expense of the spreading feature.

Due to the spreading action of the X-ray from source 56 as they travel towards CCD array 44, and the fact that each CCD device of CCD array 44 is fabricated in a square evenly spaced matrix, the spacing of the openings 54 of pinhole array 52 is not perfectly square. The necessary compensation can be easily calculated based on the distances A, B, C, D and E prior to the fabrication of pinhole array 52, and then the position of the openings 54 on pinhole array 52 may be fabricated according to these calculations.

Figure 4:
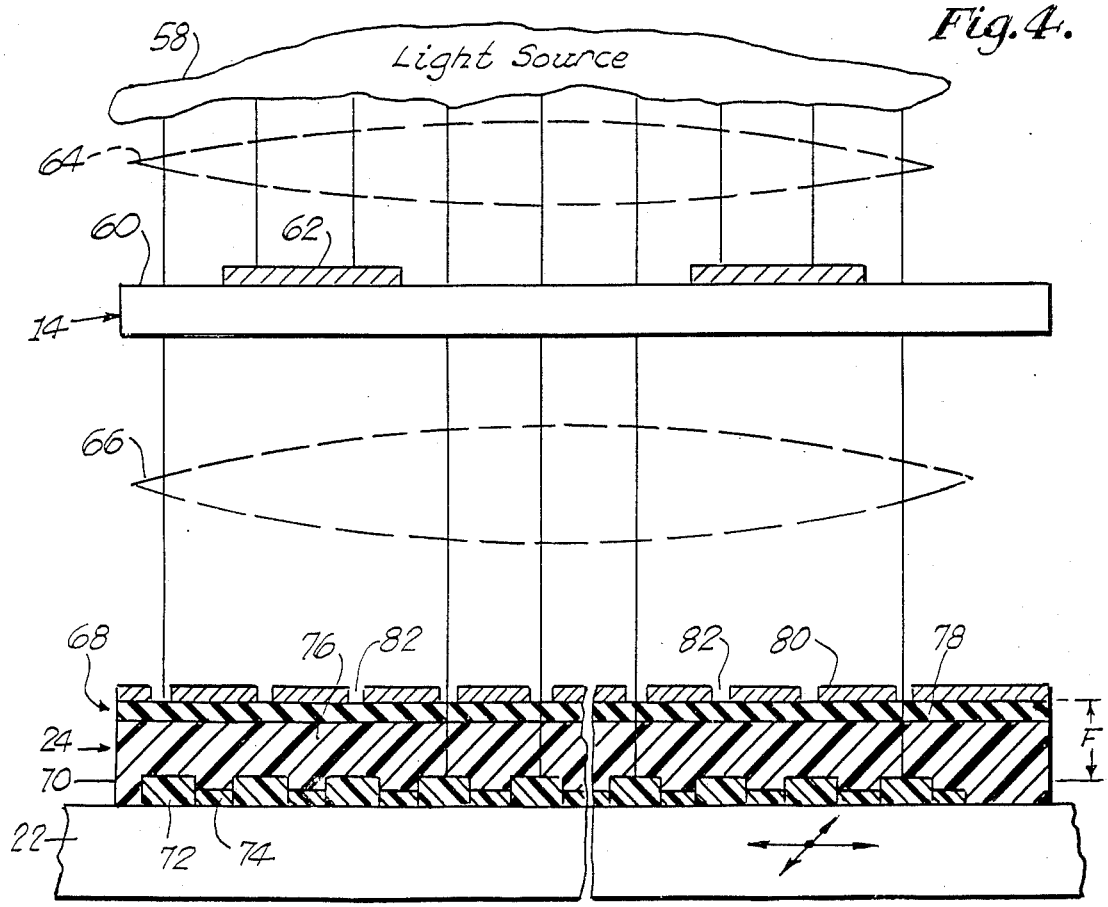
FIG. 4 shows another type of testing device of the subject invention together with the associated mask under test for use in an ultraviolet light lithography system.

Referring now to FIG. 4, an alternate embodiment of the subject invention, useful in a lithographic system having an ultraviolet light source, is shown. Ultraviolet light source 58 provides light through mask 14 which includes a glass substrate 60 having opaque material 62 placed thereon to form a desired pattern. The light which strikes opaque material 62 is blocked, whereas the light which strikes mask 14 in areas where there is an absence of opaque material 62 passes through glass substrate 60 and travels towards inspection station 24. It should be understood that a lens system 64 is positioned between source 58 and mask 14 in a conventional manner and a similar lens system 66 is positioned between mask 14 and inspection station 24 which also may be constructed in a conventional manner. Examples of lens system 64 and 66 are shown in U.S. Pat. No. 4,444,492. For simplicity, the lens system 64 and 66 are shown in dashed lines and the light rays from source 58 are shown as straight lines.

The optical inspection station 68 shown in FIG. 4 is designed somewhat differently than the x-ray inspection station 24 shown in FIG. 3. In inspection station 68, the CCD array 70 is bonded so that the charge storing region 72 and channel 74 are against nonconductive substrate 22. The substrate 76 of the CCD array is then covered by an insulating layer 78, such as glass and the pinhole array 80 is positioned on the other side of insulating layer 78. Pinhole array 80 may be fabricated by electroplating gold over insulating layer 78 and the placement of the pinholes 82 in the gold is accomplished by electron beam etching techniques to form the pinhole array 80. As was the case in FIG. 3, each of the openings 82 should be positioned directly above the charge storage region 72 of each CCD device of the charge couple device array.

The key question in the operation of the optical inspection station 68 device is how much light will be transmitted through the pinholes 82 where the size of the hole 82 is small or comparable to the wavelength of the light from source 58. If a is the radius of the opening 82 and k is the wave vector of the light field, the transmission for two states of polarization of the incident field are:

$$T(\text{PARALLEL}) = \frac{64}{2\pi^2} (ka)^4 \frac{4 + \sin^2\alpha}{4 \cos\alpha}$$

and $$T(\text{PERPENDICULAR}) = \frac{64}{27\pi^2} (ka)^4 \cos\alpha$$

where alpha is the angle of the light ray from the normal to the opening 82. In this application (ka) is approximately 0.785-0.89. Thus, the transmission is proportional to (ka) to the fourth power and is reduced only to 10-40% of the transmission of a larger opening 82. In a projection stepper, the incident flux may be 40 mJ/sq cm./ exposure, which is about 10 to the eighteenth photons/per cm squared at 2.5 ev per photon. In a 0.1 micron square area of opening 82, about 10 to the seventh photons per exposure are incident. If only 10% are transmitted by the opening 82, then 10 to the sixth photons may expose each CCD. The saturation charge on a typical CCD is between 3 and 5 times 10 to the fifth electrons per diode. The quantum efficiency of the CCD at 2.5 ev may approach 50%. Thus, enough photon flux is available through a 0.1 micron opening 82 to fully saturate the saturation region 72 of each CCD diode.

In operation, it should be noted that each of the light photons which pass through an opening 82 causes a hole and an electron to be formed in the semiconductor substrate region 76 into which the CCD is formed. The electrons then are attracted into the charged storing region 72 of the corresponding CCD diode. Since the absorption cross section of silicon at 2-3 ev is very high, the spreading of the field behind the opening 82 is not large compared to the 20 micron pixel spacing between the CCD diodes. Thus, the cross talk between each of the CCD diodes is minimal. However, in order for the difractive spreading to also be minimized, the distance F between the regions 72 and openings 82 should be held to a minimum. For example, this distance should be approximately 10 microns.

Referring now to FIGS. 5 and 6, the operation of the inspection system will now be described using the x-ray lithography system shown in FIG. 3 for exemplary purposes. In FIG. 5, the x-rays 84 are applied through a mask 14 and pinhole array 52 to the CCD array 44. It should be recalled that pinhole array 52 and CCD array 44 move together in both the x and y direction, as indicated by the arrows to the left thereof, as mask 14 is held in a relative stationary position. Only those x-rays 84 which pass through both the mask 14 and the openings 54 of pin hole array 52 are of significance in the operation description; hence it should be understood that the remaining x-rays are blocked by either x-ray absorbant material 90 on mask 14 or the lack of a pin hole 54 on array 52. As seen in FIG. 5, pinhole array 52 includes an x-ray transmitting layer 92, such as a silicon membrane, and an x-ray absorbing layer 94, such as gold, into which the openings 54 have been etched.

The x-rays 84 which ultimately reach the CCD devices 46 will first have passed through an area 86 on mask 14 which corresponds generally to the size of each of the openings 54 on array 52. Where the x-rays are not blocked by x-ray opaque material 90 on mask 14, they pass through the areas 86 and the corresponding openings 54 and strike one of the regions 46 on CCD array 44. It should be noted that the x-ray field which ultimately strikes a region 46 of CCD array 44 is continually expanding from the opening 54 so that the area 88 on array 44 is somewhat larger than the openings 54 or the mask area 86 due to this expansion of the x-ray field. Since mask 14 is positioned so close to pinhole array 52, the difference between area 86 and opening 54 is negligible.

In FIG. 6, each of the individual areas 86 of the mask is shown as a small square and the total areas 86 shown in FIG. 6 are all checked during a complete scan of a square area 96 of mask 14 equal to the area of each CCD device. It should be noted that during each step, 250,000 individual areas 86 (one for each of the 500 by 500 CCD devices) are read. As the combination of pin hole array 52 and CCD array 44 is moved in the x and y direction, each of the individual areas 86 shown in FIG. 6 becomes exposed one at a time. For those areas 86 in which the x-rays 84 penetrate through the mask, the corresponding CCD device region 46 becomes charged. With each exposure, the charge on the CCD region can be serially read out and provided to the CPU unit 40, as indicated in FIG. 2. Thereafter, the combination of CCD array 44 and pin hole array 52 is moved one step and 250,000 individual next areas 86 of mask 14 are examined and the read out of the CCD devices is for those areas. This process of moving CCD array 44 and pin hole array 52 in small discrete steps continues across an entire row of mask 14. Thereafter, mask 14 is moved one row in the y direction and the incremental stepping occurs in the opposite direction for the next row. The complete stepping pattern for each opening 54 over a square 96 is indicated by the arrows shown in FIG. 6 and this stepping pattern simultaneously occurs for each of the 250,000 squares 96. Ultimately, each little individual area of each mask section is examined by the CCD array. It should be noted that the total areas 86 shown in FIG. 6 examines one of the squares 96 of mask 14, as shown in FIG. 5.

The total number of incremental steps which must be made is dependent on the physical size of each of the CCD devices in the CCD array 44 and on the size of the openings 54. For a 20 micron square CCD and a 0.1 micron square openings 54, the number of steps would be 200 in each of the x and y directions. Thus, 40,000 incremental 0.1 micron steps would be required to examine a 20×20 micron area of the mask 14. The number of steps can be reduced by either increasing the size of each of the openings 54 or by reducing the size and increasing the number of CCD devices in array 44. For example, if the openings 54 were 2/10ths of a micron in diameter and each of the CCD devices were reduced to a 10×10 micron area, only 2,500 individual movements would be required in order to check the mask 14.

It should also be noted that the array size of 500×500 devices may be increased in order to check a mask having dimensions greater than 1 centimeter square. This can be accomplished by either building larger CCD arrays or by placing several arrays together on the substrate 22.

What we claim is:

1. A mask inspection device for inspecting features larger than a given size on an image defining mask used in a semiconductor imaging system, said system being of a type in which energy is provided towards said mask to thereby cause an image of energy to be provided during the semiconductor device fabrication process, said mask inspection system comprising:
    a substrate having an array of energy responsive devices thereon;
    an array of energy transmissive openings, each of which corresponds to and is aligned with one of said energy responsive devices and has a size related to said given size, said array of openings being positioned remote from said energy responsive devices such that any energy applied through an opening is applied to the energy responsive device corresponding to that opening; and
    means for providing data manifesting the changed condition of said energy responsive devices to comparing means for a determination of the mask features;
    said inspection device being moved in incremental steps across said image.
2. The invention according to claim 1:
    wherein each step movement is related to said given size.
3. The invention according to claim 2:
    wherein said semiconductor imaging system includes means for moving a semiconductor wafer in incremental steps across said image of array during said fabrication process; and
    wherein said inspection device replaces said wafer for inspecting said mask.
4. The invention according to claim 3:
    wherein each of said energy responsive devices has a size of a certain distance; and
    wherein said inspection device is moved said certain distance in said incremental steps.

5. The invention according to claim 2:
wherein each of said energy responsive devices has a size of a certain distance; and
wherein said inspection device is moved said certain distance in said incremental steps.

6. The invention according to claim 1:
wherein said semiconductor imaging system includes means for moving a semiconductor wafer in incremental steps across said image of array during said fabrication process; and
wherein said inspection device replaces said wafer for inspecting said mask.

7. The invention according to claim 6:
wherein each of said energy responsive devices has a size of a certain distance; and
wherein said inspection device is moved said certain distance in said incremental steps.

8. The invention according to claim 1:
wherein each of said energy responsive devices has a size of a certain distance; and
wherein said inspection device is moved said certain distance in said incremental steps.

9. The invention according to claim 1:
wherein said energy source is x-rays; and
wherein said array of openings is positioned above said array of energy responsive devices by an amount related to the distance between the source of x-rays and the array of openings and the source size.

10. The invention according to claim 9 wherein said amount that array of openings is positioned above said array of energy responsive devices is further related to the size of each energy responsive device.

11. The invention according to claim 10:
wherein said inspection device is moved in incremental steps across said image, each step movement being related to said given distance.

12. The invention according to claim 11:
wherein said semiconductor imaging system includes means for moving a semiconductor wafer in incremental steps across said image of array during said fabrication process; and
wherein said inspection device replaces said wafer for inspecting said mask.

13. The invention according to claim 12:
wherein each of said energy responsive devices has a size of a certain distance; and
wherein said inspection device is moved said certain distance in said incremental steps.

14. The invention according to claim 1:
wherein said energy source is light; and
wherein said array of openings is positioned at a distance from the array of energy responsive devices so that the difractive spreading of the light beyond the opening is less than the size of the energy responsive device.

15. The invention according to claim 14:
wherein each step movement is related to said given size.

16. The invention according to claim 15:
wherein said semiconductor imaging system includes means for moving a semiconductor wafer in incremental steps across said image of array during said fabrication process; and
wherein said inspection device replaces said wafer for inspecting said mask.

17. The invention according to claim 1:
wherein said means for providing data includes means for reading, one at a time, the energy stored by each of said energy responsive devices, light transmitting means and means for modulating said light transmitting means in response to each device read; and
wherein said comparing means includes light receiving means responsive to said light transmitting means.

18. The invention according to claim 17:
wherein each step movement is related to said given size.

19. The invention according to claim 18:
wherein said semiconductor imaging system includes means for moving a semiconductor wafer in incremental steps across said image of array during said fabrication process; and
wherein said inspection device replaces said wafer for inspecting said mask.

20. The invention according to claim 19:
wherein each of said energy responsive devices has a size of a certain distance; and
wherein said inspection device is moved said certain distance in said incremental steps.

21. The invention according to claim 17:
wherein said energy source is x-rays; and
wherein said array of openings is positioned above said array of energy responsive devices by an amount related to the distance between the source of x-rays and the array of openings and the source size.

22. The invention according to claim 21 wherein said amount of said array of openings is positioned above said array of energy responsive devices is further related to the size of each energy responsive device.

23. The invention according to claim 17:
wherein said energy source is light; and
wherein said array of openings is positioned at a distance from the array of energy responsive devices so that the difractive spreading of the light beyond the opening is less than the size of the energy responsive device.

24. The invention according to claim 16:
wherein each of said energy responsive devices has a size of a certain distance; and
wherein said inspection device is moved said certain distance in said incremental steps.

25. A mask inspection system for inspecting features above a given size of a mask used in a semiconductor fabrication machine of a type in which energy is selectively directed through said mask to cause a pattern of energy to expose a resist covered wafer, said system comprising:
holding means for being moved in incremental steps related to said given size;
a first array of energy responsive devices having a certain center to center spacing, said array of devices being positioned on said holding means;
a second array of energy transmissive openings fixedly positioned to and above said first array, each opening being associated with a different one of said energy responsive devices and having a size related to said given size; and
means for providing data manifesting the condition of each of said energy responsive devices for comparison against stored data manifesting the desired features of said mask.

26. The invention according to claim 25 wherein said moving means moves a number of steps so that the total movement is related to said center to center spacing of said array of devices.

27. The invention according to claim 26 wherein said array of energy responsive devices is an array of charge coupled devices.

28. The invention according to claim 26 wherein said array of energy responsive devices is an array of charge injected devices.

29. The invention according to claim 25 wherein each opening of said second array is less than one micron in maximum length.

30. The invention according to claim 29 wherein said moving means moves a number of steps so that the total movement is related to said center to center spacing of said array of devices.

31. The invention according to claim 30 wherein said array of energy responsive devices is an array of charge coupled devices.

32. The invention according to claim 31 wherein said array of energy responsive devices is an array of charge injected devices.

33. The invention according to claim 25 wherein the total number of energy responsive devices is related to the size of each device and the size of said mask.

34. The invention according to claim 33 wherein said moving means moves a number of steps so that the total movement is related to said center to center spacing of said array of devices.

35. The invention according to claim 34 wherein said array of energy responsive devices is an array of charge coupled devices.

36. The invention according to claim 35 wherein said array of energy responsive devices is an array of charge injected devices.

37. The invention according to claim 35 wherein each opening of said second array is less than one micron in maximum length.

38. The invention according to claim 25 wherein said means for providing data includes means for reading the energy level of each of said energy responsive devices, light transmitting means and means for modulating said light transmitting means in response to said energy level of said energy responsive devices.

39. The invention according to claim 25 wherein said system further includes means for receiving the data provided by said means for providing data for comparing said provided data with data stored for a known good mask.

40. The invention according to claim 39 wherein said means for receiving includes computer means and mass data storage means.

41. The invention according to claim 40 wherein each opening of said second array is less than one micron in maximum length.

42. The invention according to claim 41 wherein said means for receiving further includes light receiving means for receiving the light signal transmitted by said light transmitting means.

43. The invention according to claim 42 wherein said means for providing data further includes analog to digital converter means for converting the energy level of each energy responsive device to a digital signal.

44. The invention according to claim 43 wherein said moving means moves a number of steps so that the total movement is related to said center to center spacing of said array of devices.

45. The invention according to claim 44 wherein said array of energy responsive devices is an array of charge coupled devices.

46. The invention according to claim 45 wherein said array of energy responsive devices is an array of charge injected devices.

47. The invention according to claim 45 wherein each opening of said second array is less than one micron in maximum length.

48. The invention according to claim 45 wherein the total number of energy responsive devices is related to the size of each device and the size of said mask.

49. The invention according to claim 48 wherein said array of energy responsive devices is an array of charge injected devices.

50. The invention according to claim 49 wherein each opening of said second array is less than one micron in maximum length.

* * * * *